US011770117B2

(12) United States Patent
Yang

(10) Patent No.: US 11,770,117 B2
(45) Date of Patent: Sep. 26, 2023

(54) DATA RECEIVING CIRCUIT

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/544,574

(22) Filed: Dec. 7, 2021

(65) Prior Publication Data

US 2023/0179189 A1 Jun. 8, 2023

(51) Int. Cl.
*H03K 3/023* (2006.01)
*H03K 3/356* (2006.01)
*G11C 7/06* (2006.01)

(52) U.S. Cl.
CPC .......... *H03K 3/356113* (2013.01); *G11C 7/06* (2013.01)

(58) Field of Classification Search
CPC .. H03K 3/023; H03K 3/0233; H03K 3/02335; H03K 3/027; H03K 3/037; H03K 3/0375; H03K 5/02; H03K 5/023; H03K 5/08; H03K 5/082; H03K 5/22; H03K 5/24; H03K 5/2472; H03K 5/2481; H03K 5/249; H03K 17/6872; H03K 3/356; H03K 3/356017; H03K 3/356034; H03K 3/356104; H03K 3/356113; G11C 7/06; G11C 7/062; G11C 7/065; G11C 7/1048; G11C 7/106; G11C 7/1087; G01R 19/16566; G01R 19/16576
See application file for complete search history.

(56) References Cited

U.S. PATENT DOCUMENTS

| | | | |
|---|---|---|---|
| 5,828,257 A | 10/1998 | Masleid | |
| 6,037,815 A | 3/2000 | Togami | |
| 7,944,769 B1 | 5/2011 | Lesea | |
| 9,985,620 B2 * | 5/2018 | Ihs | H03K 5/24 |
| 10,594,265 B2 | 3/2020 | Hwang | |
| 10,665,292 B1 * | 5/2020 | Raad | G11C 7/1048 |
| 10,878,858 B2 * | 12/2020 | Matsuno | G11C 7/106 |
| 2005/0156859 A1 | 7/2005 | Jang et al. | |
| 2011/0235394 A1 | 9/2011 | Sasaki et al. | |
| 2012/0293209 A1 | 11/2012 | Takewaki | |
| 2018/0013433 A1 | 1/2018 | Shoichi | |
| 2019/0386615 A1 | 12/2019 | Jonghan | |

FOREIGN PATENT DOCUMENTS

| | | |
|---|---|---|
| CN | 1612468 A | 5/2005 |
| CN | 1992511 A | 7/2007 |
| CN | 106169280 A | 11/2016 |
| KR | 20150072972 A | 12/2013 |
| TW | 201225537 A | 6/2012 |
| TW | 201906319 A | 2/2019 |
| TW | I714129 B | 12/2020 |

* cited by examiner

*Primary Examiner* — Long Nguyen
(74) *Attorney, Agent, or Firm* — Muncy, Geissler, Olds & Lowe, P.C.

(57) ABSTRACT

A data receiving circuit is provided. The data receiving circuit includes a data input circuit, a latch circuit, and a current source. The data input circuit is configured to receive an input signal. The latch circuit is configured to output an output signal in response to the input signal. The current source is configured to provide a current to the latch circuit. The current source is different from the data input circuit.

11 Claims, 8 Drawing Sheets

DATA RECEIVING CIRCUIT

TECHNICAL FIELD

The present disclosure relates to a data receiving circuit, and more particularly, to a data receiving circuit having a sense amplifier.

DISCUSSION OF THE BACKGROUND

In memory devices, input receivers are widely used to receive input signals. However, as requirements for the operation speed of memory devices are getting higher and higher, input receivers may not be able to keep up, resulting in a small margin to correctly determine input data. In the event that input data is incorrectly interpreted, memory devices may crash or operate abnormally.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a data receiving circuit. The data receiving circuit includes a data input circuit, a latch circuit, and a current source. The data input circuit is configured to receive an input signal. The latch circuit is configured to output an output signal in response to the input signal. The current source is configured to provide a current to the latch circuit. The current source is different from the data input circuit Another aspect of the present disclosure provides a data receiving circuit. The data receiving circuit includes a first transistor, a second transistor, a third transistor, and a latch circuit. The first transistor has a gate configured to receive an input signal. The latch circuit is configured to output an output signal in response to the input signal. The second transistor has a gate configured to receive a first signal and a drain connected to the latch circuit. The third transistor has a gate configured to receive the first signal and a drain connected to the latch circuit. The second transistor and the third transistor are configured to provide a current to the latch circuit in response to the first signal.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
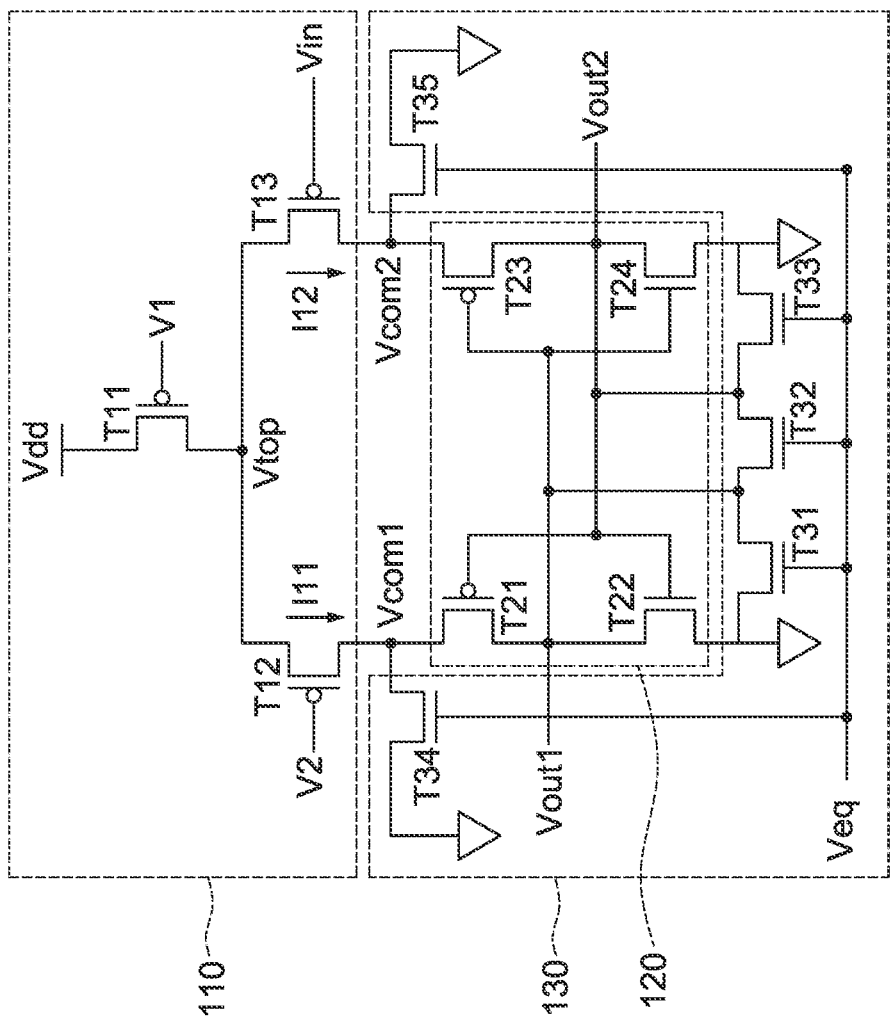
FIG. 1A is a schematic diagram illustrating a data receiving circuit, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic diagram illustrating a data receiving circuit 100 (or a data receiver) in accordance with some embodiments of the present disclosure. The data receiving circuit 100 includes an input circuit 110, a latch circuit 120, and an equalizer 130. In some embodiments, the data receiving circuit 100 may be or may include a sense amplifier. In some embodiments, the input circuit 110 and the latch circuit 120 may be collectively referred to as a sense amplifier.

The input circuit 110 includes transistors T11, T12, and T13. In some embodiments, the transistors T11, T12, and T13 are P-type metal-oxide-semiconductor (PMOS) transistors. A source of the transistor T11 is connected to receive a supply voltage Vdd. A gate of the transistor T11 is connected to receive a clock signal V1. A drain of the transistor T11 is connected to a source of the transistor T12 and a source of the transistor T13. A gate of the transistor T12 is connected to receive a reference signal V2. A drain of the transistor T12 is connected to the latch circuit 120 (e.g., to a source of the transistor T21). A gate of the transistor T13 is connected to receive an input signal Vin. A drain of the transistor T13 is connected to the latch circuit 120 (e.g., to a source of the transistor T23). In some embodiments, the reference signal V2 has a voltage level in a range from about 0.1 Vdd to about 0.42 Vdd. In other embodiments, the reference signal V2 may have other voltage levels depending on design requirements. In some embodiments, the input signal Vin has a voltage level in a range from about −0.2V to about Vdd+0.2V. In other embodiments, the input signal Vin may have other voltage levels depending on design requirements.

The latch circuit 120 may include two inverters in which an output of one inverter is connected to an input of the other inverter. As shown in FIG. 1A, the latch circuit 120 includes transistors T21, T22, T23, and T24. The transistors T21 and T22 define an inverter while the transistors T23 and 24 define the other inverter. The transistors T21 and T23 are PMOS transistors and the transistors T22 and T24 are N-type metal-oxide-semiconductor (NMOS) transistors.

A source of the transistor T21 is connected to the drain of the transistor T12. A gate of the transistor T21 is connected to a gate of the transistor T22, a drain of the transistor T23, and a drain of the transistor T24. A drain of the transistor T21 is connected to a drain of the transistor T22. A source of the transistor T22 is connected to a common voltage (e.g., ground). The drain of the transistor T21 and the drain of the transistor T22 may function as an output Vout1 of the data receiving circuit 100.

A source of the transistor T23 is connected to the drain of the transistor T13. A drain of the transistor T23 is connected to a drain of the transistor T24. A source of the transistor T24 is connected to the common voltage (e.g., ground). The drain of the transistor T23 and the drain of the transistor T24 may function as an output Vout2 of the data receiving circuit 100.

The equalizer 130 includes transistors T31, T32, T33, T34, and T35. In some embodiments, the transistors T31, T32, T33, T34, and T35 are NMOS transistors. Gates of the transistors T31, T32, T33, T34, and T35 are connected to each other to receive an equalizing signal Veq. A source of the transistor T31 is connected to the common voltage (e.g., ground). A source of the transistor T33 is connected to the common voltage (e.g., ground). A source of the transistor T34 is connected to the common voltage (e.g., ground). A source of the transistor T35 is connected to the common voltage (e.g., ground). The transistor T32 is connected between the transistors T31 and T33.

Figure 1B:
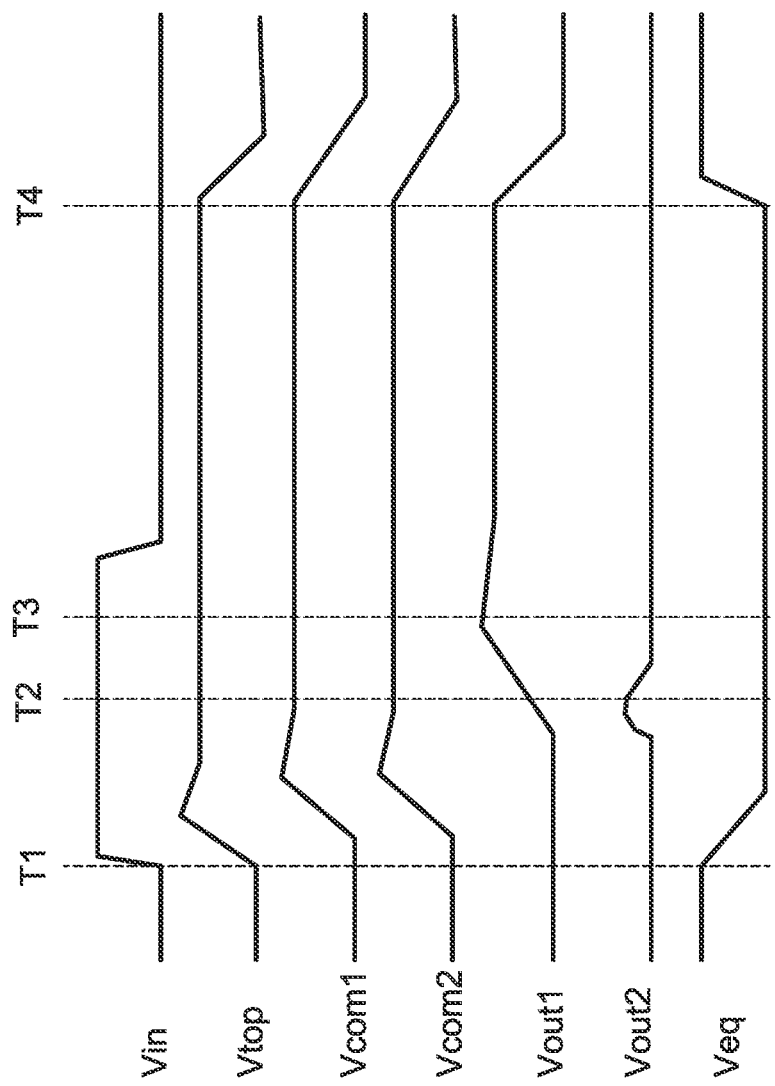
FIG. 1B illustrates timing diagrams of waveforms at different nodes of the data receiving circuit as shown in FIG. 1A, in accordance with some embodiments of the present disclosure.

FIG. 1B illustrates timing diagrams of waveforms at different nodes of the data receiving circuit 100 as shown in FIG. 1A, in accordance with some embodiments of the present disclosure.

Figure 1C:
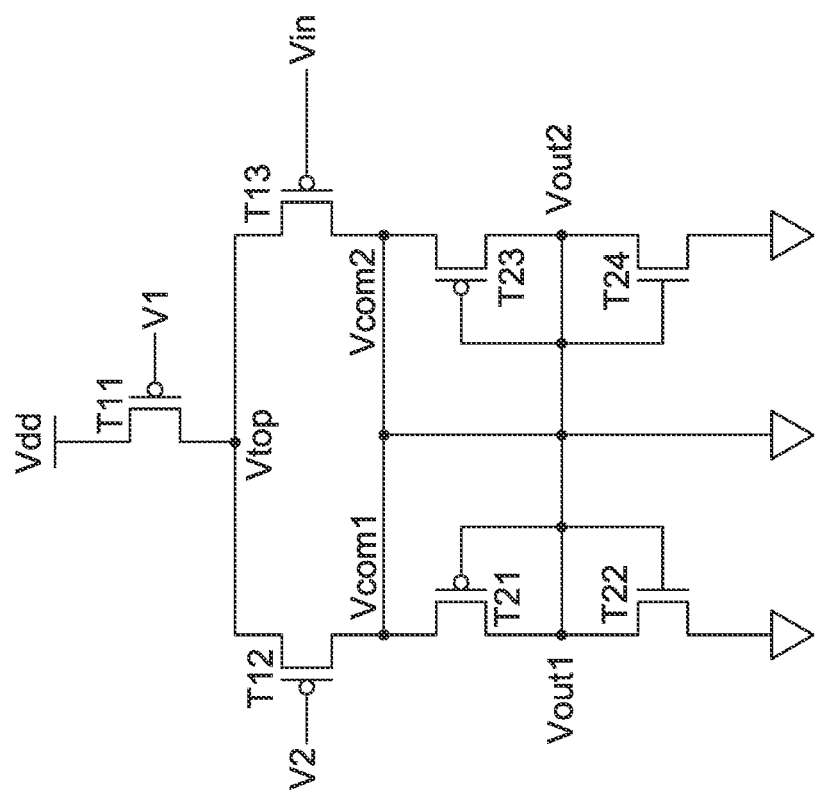
FIG. 1C illustrates an equivalent circuit of the data receiving circuit as shown in FIG. 1A, in accordance with some embodiments of the present disclosure.

In some embodiments, prior to the time T1, the data receiving circuit 100 is configured to operate at an equalizing stage. In this stage, the equalizer 130 is enabled. The equalizing signal Veq with a high logic level (e.g., logical value "1") is inputted to the gates of the transistors T31, T32, T33, T34, and T35 to turn on those transistors. Thus, the voltages Vcom1 at the drain of the transistor T12, Vcom2 at the drain of the transistor T13, Vout1, and Vout2 would be pulled down to the common voltage (e.g., ground) as shown in FIG. 1C, which illustrates an equivalent circuit of the data receiving circuit 100 operating in the equalizing stage.

Figure 1D:
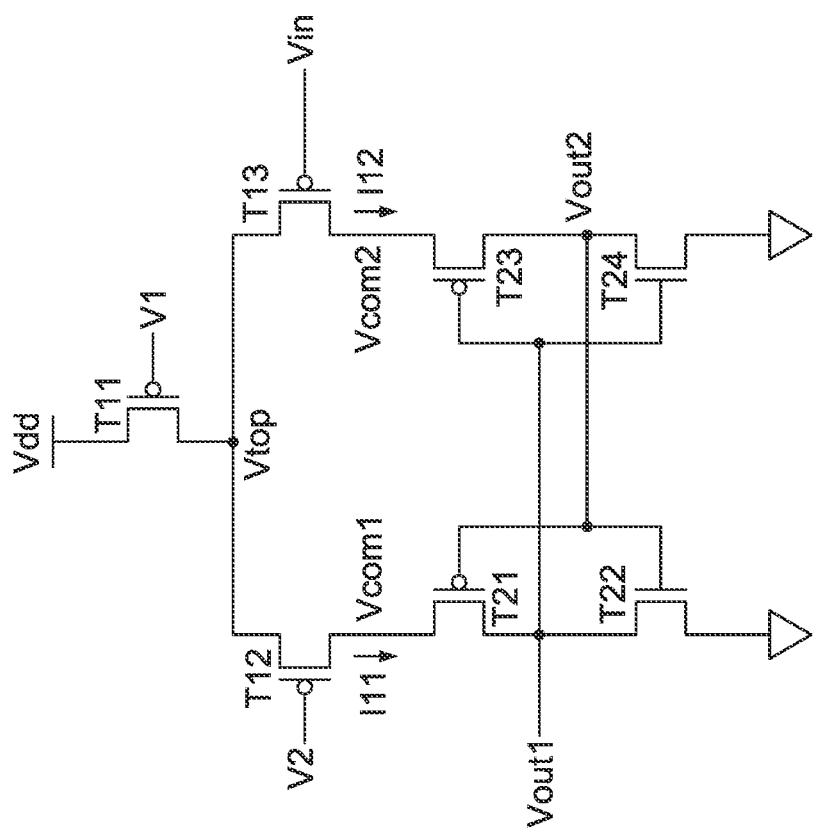
FIG. 1D illustrates an equivalent circuit of the data receiving circuit as shown in FIG. 1A, in accordance with some embodiments of the present disclosure.

After the time T1, the equalizing stage is completed, and thus the equalizing signal Veq with a low logic level (e.g., logical value "0") is inputted to the gates of the transistors T31, T32, T33, T34, and T35 to turn off those transistors. The equalizer 130 is turned off. FIG. 1D illustrates an equivalent circuit of the data receiving circuit 100 operating in this stage, in accordance with some embodiments of the present disclosure.

At the time T1, an input signal Vin having a high logic level (e.g., logical value "1") is inputted to the gate of the transistor T13. The voltage Vtop at the drain of the transistor T11 (or at the source of the transistor T12 or T13) starts rising. For example, the voltage Vtop is pulled up. The voltage Vcom1 at the drain of the transistor T12 (or at the source of the transistor T21) starts rising as well. For example, the voltage Vcom1 is pulled up. The voltage Vcom2 at the drain of the transistor T13 (or at the source of the transistor T23) starts rising as well. For example, the voltage Vcom2 is pulled up.

Since the voltage (e.g., the input signal Vin) at the gate of the transistor T13 is higher than the voltage (e.g., the reference signal V2) at the gate of the transistor T12, a current I11 flowing through the transistor T12 is larger than a current I12 flowing through the transistor T13. After a sufficient period of time, the transistor T21 is fully turned on. Since the voltage Vout 2 at the gates of the transistors T21 and T22 has been pulled down to the common voltage (e.g., ground) during the equalizing stage, the transistors T21 and T24 are fully turned on and the transistors T22 and T23 are fully turned off. Therefore, the voltage Vout1 at the drains of the transistors T21 and T22 (or at the gates of the transistors T23 and T24) starts rising at the time T2. For example, the voltage Vout1 is pulled up at the time T2.

In some embodiments, at the time T2, the data receiving circuit 100 is configured to operate at a data development stage. At the time T3, the voltage Vout1 at the drains of the transistors T21 and T22 (or at the gates of the transistors T23 and T24) has been completely pulled up to the high logic level (e.g., logical value "1"). In some embodiments, during the time T3 and the time T4, the data receiving circuit 100 is configured to operate at a data latch stage.

After a period for data input (e.g., from the time T1 to the time T4) has been completed, the data receiving circuit 100 is configured to operate at an equalizing stage again at the time period T4.

When operating during the period for data input (e.g., from the time T1 to the time T4), the data receiving circuit 100 is configured to output the voltage Vout1 having a high logic level (e.g., logical value "1") if the voltage of the input signal Vin is higher than the voltage of the reference signal V2; and the data receiving circuit 100 is configured to output the voltage Vout1 having a low logic level (e.g., logical value "0") if the voltage of the input signal Vin is lower than the voltage of the reference signal V2. However, due to the parasitic elements (e.g., resistance, inductance and/or capacitance) existing at the drains of the transistors T12 and T13, the current I11 and the current I12 have to charge (or discharge) said parasitic elements to pull up (or pull down) the voltages Vcom1 and Vcom2.

As shown in FIGS. 1A and 1D, the current I11 and the current I12 are determined by the transistors T12 and T13, respectively. For example, the current I11 (or the current I12) can be determined by a voltage difference between the source and the gate (e.g., Vsg) of the transistor T12 (or the transistor T13). However, due to relatively high voltages V2 (e.g., about 0.1 Vdd to about 0.42 Vdd) and Vin (about Vdd+0.2V) at the gates of the transistors T12 and T13, the current I11 and the current I12 would be reduced, which would render a relatively longer rising time (or falling time) of the voltage Vout1. For example, as shown in FIG. 1B, the voltage Vout1 rises slowly compared with the input signal Vin. This situation becomes serious when the operation speed of the data receiving circuit 100 increases. In some cases, the voltage Vout1 may not correctly reflect the input signal Vin, causing the data receiving circuit 100 to be abnormal.

Figure 2A:
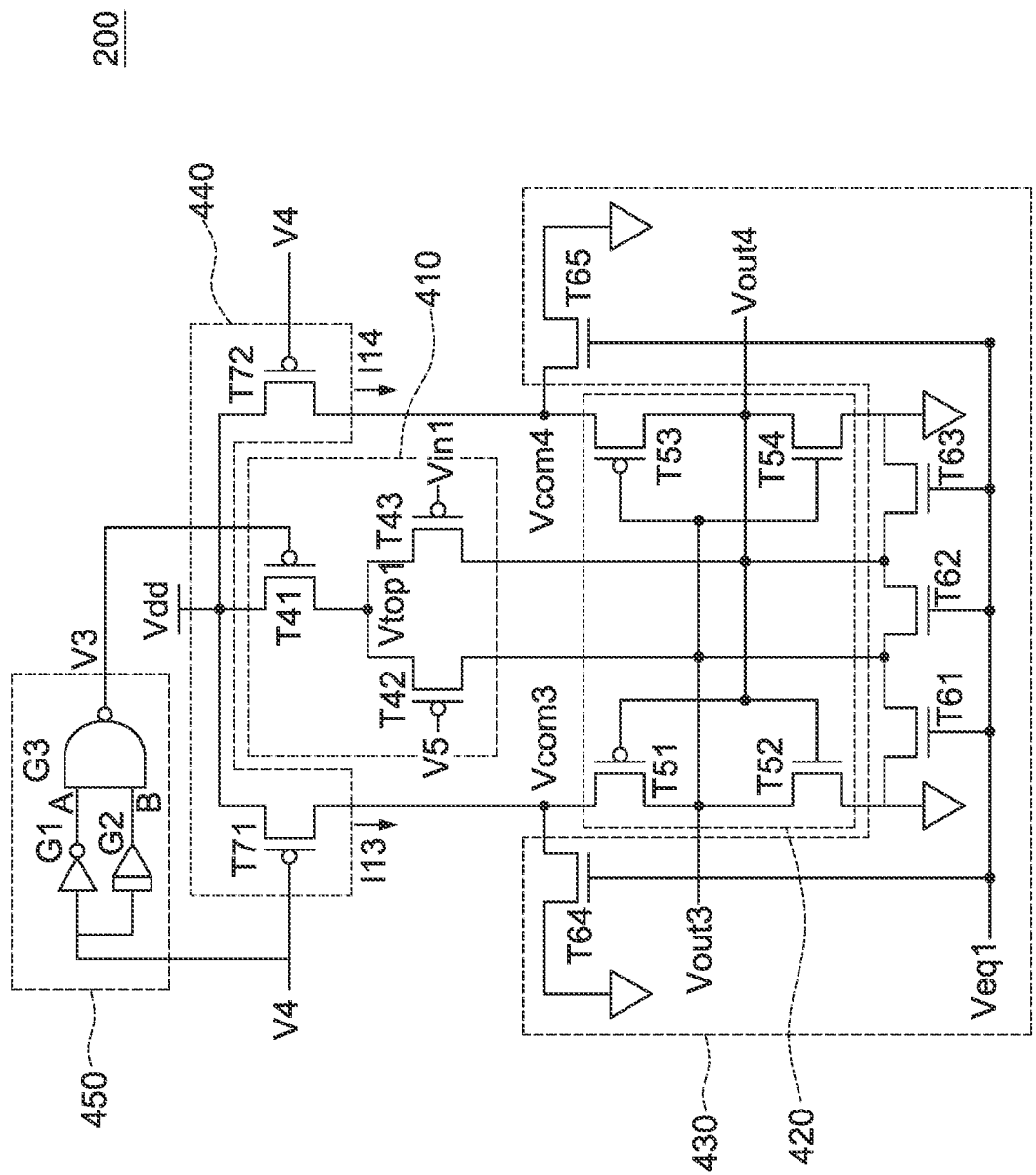
FIG. 2A is a schematic diagram illustrating a data receiving circuit, in accordance with some embodiments of the present disclosure.

FIG. 2A is a schematic diagram illustrating a data receiving circuit 200 (or a data receiver), in accordance with some embodiments of the present disclosure. The data receiving circuit 200 includes an input circuit 410, a latch circuit 420, an equalizer 430, a current source (or a current sink) 440, and a pulse generator 450. In some embodiments, the data receiving circuit 200 may be or may include a sense amplifier.

The input circuit 410 includes transistors T41, T42, and T43. In some embodiments, the transistors T41, T42, and T43 are P-type metal-oxide-semiconductor (PMOS) transistors. A source of the transistor T41 is connected to receive a supply voltage Vdd. A gate of the transistor T41 is connected to receive a signal V3 from the pulse generator 450. A drain of the transistor T41 is connected to a source of the transistor T42 and a source of the transistor T43. A gate of the transistor T42 is connected to receive a reference signal V5. A drain of the transistor T42 is connected to the latch circuit 420 (e.g., to a drain of a transistor T51, a drain of the transistor T52, a gate of the transistor T53, and a gate of the transistor T54). The drain of the transistor T42 is also connected to the equalizer 430. A gate of the transistor T43 is connected to receive an input signal Vin1. A drain of the transistor T43 is connected to the latch circuit 420 (e.g., to a drain of a transistor T53, a drain of the transistor T54, a gate of the transistor T51, and a gate of the transistor T52). The drain of the transistor T43 is also connected to the equalizer 430.

In some embodiments, the reference signal V5 has a voltage level in a range from about 0.1 Vdd to about 0.42 Vdd. In other embodiments, the reference signal V5 may have other voltage levels depending on design requirements. In some embodiments, the input signal Vin1 has a voltage level in a range from about −0.2V to about Vdd+0.2V. In other embodiments, the input signal Vin1 may have other voltage levels depending on design requirements.

Figure 2B:
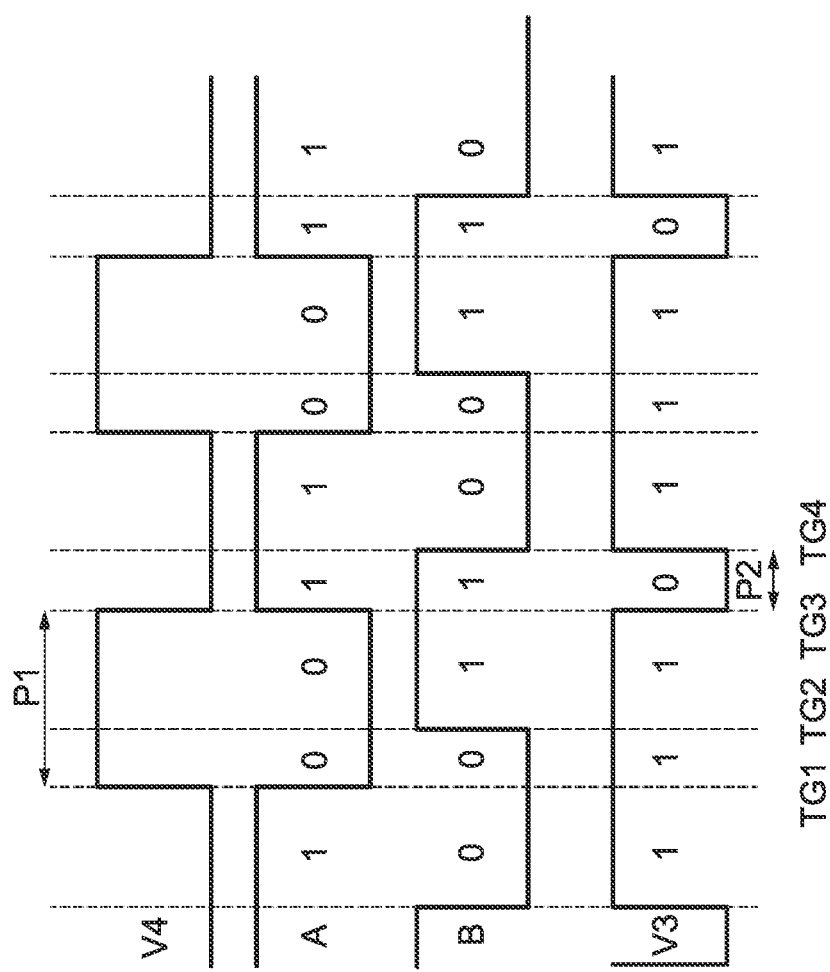
FIG. 2B illustrates timing diagrams of waveforms at different nodes of the data receiving circuit as shown in FIG. 2A, in accordance with some embodiments of the present disclosure.
Figure 2C:
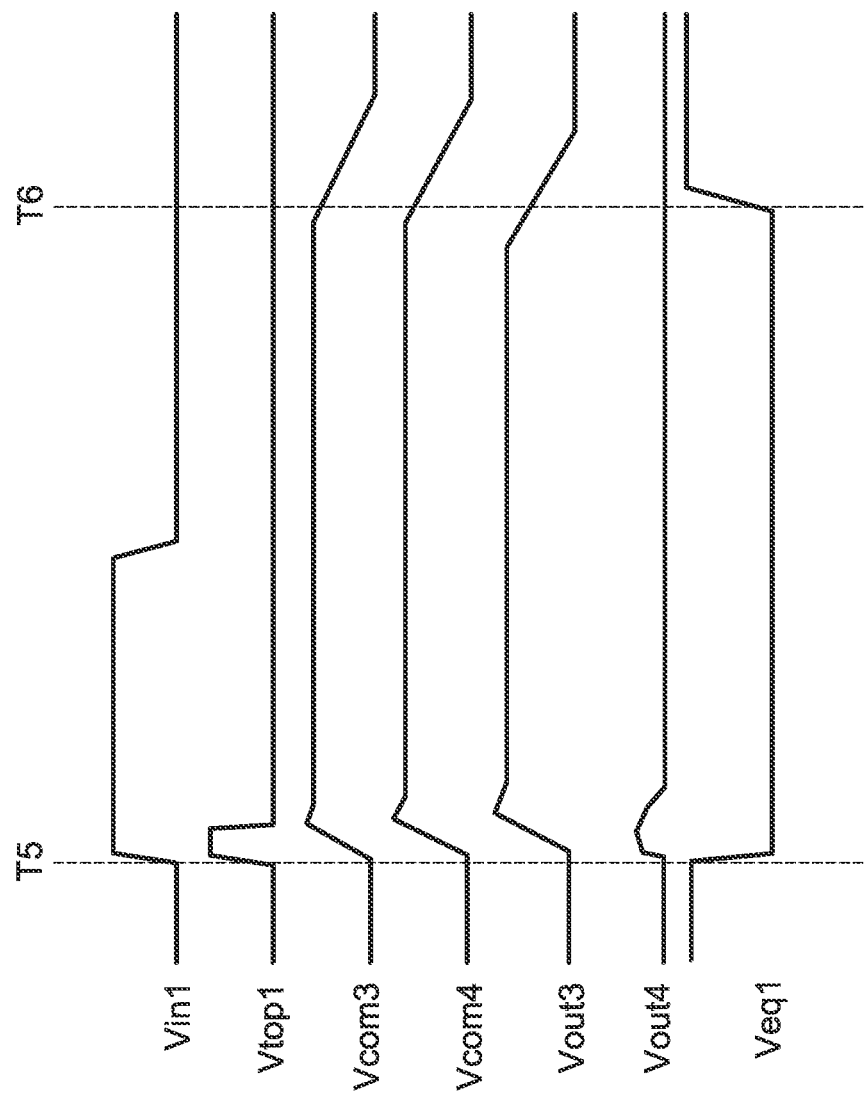
FIG. 2C illustrates timing diagrams of waveforms at different nodes of the data receiving circuit as shown in FIG. 2A, in accordance with some embodiments of the present disclosure.
Figure 2D:
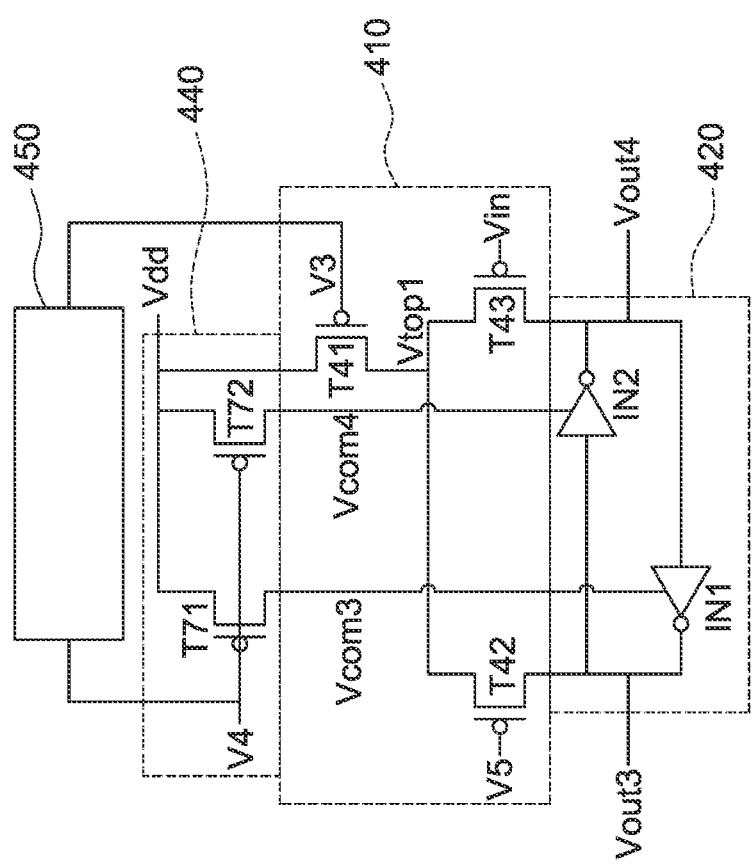
FIG. 2D illustrates an equivalent circuit of the data receiving circuit as shown in FIG. 2A, in accordance with some embodiments of the present disclosure.

The latch circuit 420 may include two inverters (e.g., the inverters IN1 and IN2 as shown in FIG. 2D) in which an output of one inverter is connected to an input of the other inverter. As shown in FIG. 2A, the latch circuit 420 includes transistors T51, T52, T53, and T54. The transistors T51 and T52 define an inverter while the transistors T53 and 54 define the other inverter. The transistors T51 and T53 are PMOS transistors and the transistors T52 and T54 are N-type metal-oxide-semiconductor (NMOS) transistors.

A source of the transistor T51 is connected to the current source 440 (e.g., to a drain of a transistor T71). A gate of the transistor T51 is connected to a gate of the transistor T52, a drain of the transistor T53, and a drain of the transistor T54. A drain of the transistor T51 is connected to a drain of the transistor T52. A source of the transistor T52 is connected to a common voltage (e.g., ground). The drain of the transistor T51 and the drain of the transistor T52 may function as an output Vout3 of the data receiving circuit 200.

A source of the transistor T53 is connected to the current source 440 (e.g., to a drain of a transistor T72). A drain of the transistor T53 is connected to a drain of the transistor T54. A source of the transistor T54 is connected to the common voltage (e.g., ground). The drain of the transistor T53 and the drain of the transistor T54 may function as an output Vout4 of the data receiving circuit 200.

The equalizer 430 includes transistors T61, T62, T63, T64, and T65. In some embodiments, the transistors T61, T62, T63, T64, and T65 are NMOS transistors. Gates of the transistors T61, T62, T63, T64, and T65 are connected to each other to receive an equalizing signal Veq1. A source of the transistor T61 is connected to the common voltage (e.g., ground). A source of the transistor T63 is connected to the common voltage (e.g., ground). A source of the transistor T64 is connected to the common voltage (e.g., ground). A source of the transistor T65 is connected to the common voltage (e.g., ground). The transistor T62 is connected between the transistors T61 and T63.

The current source 440 includes transistors T71 and T72. In some embodiments, the transistors T71 and T72 are PMOS transistors. A source of the transistor T71 is connected to receive a supply voltage Vdd. A gate of the transistor T71 is connected to receive a signal V4. A drain of the transistor T71 is connected to the latch circuit 420. A source of the transistor T72 is connected to receive a supply voltage Vdd. A gate of the transistor T72 is connected to receive a signal V4. A drain of the transistor T72 is connected to the latch circuit 420.

The pulse generator 450 may include an inverter G1, a delay circuit (or a buffer) G2, and an NAND gate G3. FIG. 2B illustrates timing diagrams of waveforms at different nodes of the pulse generator 450, in accordance with some embodiments of the present disclosure.

In operation, the pulse generator 450 is configured to receive an input (e.g., the signal V4) having a first logical value with a period P1 and to generate an output (e.g., the signal V3) having a second logical value with a period P2. In some embodiments, the first logical value is different from the second logical value. For example, as shown in FIG. 2B, the first logical value is 1 and the second logical value is 0. In some embodiments, the period P2 is less than the period P1. For example, P2 is equal to n×P1, where 0<n<1. In some embodiments, n is about ⅓.

In some embodiments, n can be determined by the delay time of the delay circuit G2. As shown in FIG. 2B, at the time TG1, the signal V4 having a logical value "1" is inputted to the pulse generator 450. The inverter G1 is configured to generate an output signal A having a logical value "0." The delay circuit G2 is configured to generate an output signal B having a logical value "1" at the time TG2. The difference between the time TG2 and the time TG1 is the delay time of the delay circuit G2. At the time TG3, the signal V4 having a logical value "0" is inputted to the pulse generator 450. The inverter G1 is configured to generate an output signal A having a logical value "1." The delay circuit G2 is configured to generate an output signal B having a logical value "0" at the time TG4. During the time TG3 and the time TG4, both the inverter G1 and the delay circuit G2 are configured to generate signals having a logical value "1," and thus the NAND gate G3 is configured to generate the signal V3 having a logical "0." In some embodiments, the difference between the time TG4 and the time TG3 is the period P2 of the pulse signal (e.g., the signal V3) generated by the pulse generator 450. In some embodiments, the difference between the time TG4 and the time TG3 is the delay time of the delay circuit G2.

FIG. 2C illustrates timing diagrams of waveforms at different nodes of the data receiving circuit 200 as shown in FIG. 2A, in accordance with some embodiments of the present disclosure.

In some embodiments, prior to the time T5, the data receiving circuit 200 is configured to operate at an equalizing stage. In this stage, the equalizer 430 is enabled. The equalizing signal Veq1 with a high logic level (e.g., logical value "1") is inputted to the gates of the transistors T61, T62, T63, T64, and T65 to turn on those transistors. Thus, the voltages Vcom3, Vcom4, Vout3, and Vout4 would be pulled down to the common voltage (e.g., ground).

After the time T5, the equalizing stage is completed, and thus the equalizing signal Veq1 with a low logic level (e.g., logical value "0") is inputted to the gates of the transistors T61, T62, T63, T64, and T65 to turn off those transistors. The equalizer 430 is turned off. FIG. 2D illustrates an equivalent circuit of the data receiving circuit 100 operating in this stage, in accordance with some embodiments of the present disclosure.

At the time T5, an input signal Vin1 having a high logic level (e.g., logical value "1") is inputted to the gate of the transistor T43. Meanwhile, the signals V3 and V4 having a logical value "0" (e.g., during the time TG3 and the time TG4 as shown in FIG. 2B) are inputted to the gates of the transistors T41, T71, and T72 to turn on the transistors T41, T71, and T72. The voltage Vtop1 at the drain of the transistor T41 (or at the source of the transistor T42 or T43) starts rising. For example, the voltage Vtop1 is pulled up. The voltage Vcom3 at the drain of the transistor T71 starts rising as well. For example, the voltage Vcom3 is pulled up. The voltage Vcom4 at the drain of the transistor T72 starts rising as well. For example, the voltage Vcom4 is pulled up.

Since the voltage (e.g., the input signal Vin1) at the gate of the transistor T43 is higher than the voltage (e.g., the reference signal V5) at the gate of the transistor T42, the voltage Vout3 at the drains of the transistors T51 and T52 (or at the gates of the transistors T53 and T54) starts rising as well. For example, the voltage Vout3 is pulled up. After a period for data input (e.g., from the time T5 to the time T6) has been completed, the data receiving circuit 200 is configured to operate at an equalizing stage again at the time period T6.

When operating during the period for data input (e.g., from the time T5 to the time T6), the data receiving circuit 200 is configured to output the voltage Vout3 having a high logic level (e.g., logical value "1") if the voltage of the input signal Vin1 is higher than the voltage of the reference signal V5; and the data receiving circuit 200 is configured to output the voltage Vout3 having a low logic level (e.g., logical value "0") if the voltage of the input signal Vin1 is lower than the voltage of the reference signal V5. After the input signal Vin1 has been inputted to the transistor T43 and before the data operation has been completed by the latch circuit 420 (e.g., after the time TG4 as shown in FIG. 2B), the pulse generator 450 is configured to generate the signal V3 having a logical value "1" to turn off the transistor T41, so as to prevent the circuit from being damaged due to a short circuit between Vdd and ground.

In accordance with some embodiments, as shown in FIGS. 2A-2D, during the period for data input, the gates of the transistors T41, T71, and T72 are inputted with signals having a logical value "0." In other words, during the period for data input, the gates of the transistors T41, T71, and T72 are connected to ground. Therefore, a voltage difference between the source and the gate (e.g., Vsg) of the transistor T71 (or the transistor T72) is higher than a voltage difference between the source and the gate (e.g., Vsg) of the transistor T12 (or the transistor T13) as shown in FIG. 1A, which renders the current I13 and the current I14 generated by the transistors T71 and T72 larger than the current I11 and the current I12 generated by the transistors T12 and T13. Compared with the data receiving circuit 100 as shown in FIG. 1A, the data receiving circuit 200 can charge or discharge the parasitic elements (e.g., resistance, inductance and/or capacitance) with the larger current I13 and I14, which can increase the response time of the output (e.g., the voltage Vout3) of the data receiving circuit 200. In other words, the rising time (or falling time) of the voltage Vout3 can be reduced. Which can increase the tolerance and the operation speed of the data receiving circuit 200.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A data receiving circuit, comprising:
    a data input circuit configured to receive an input signal;
    a latch circuit configured to output an output signal in response to the input signal;
    a current source configured to provide a current to the latch circuit, wherein the current source is different from the data input circuit; and
    a pulse generator configured to receive a first signal and to generate and output a second signal, in response to the first signal, to the data input circuit;
    wherein a period of the first signal is larger than a period of the second signal.

2. The data receiving circuit of claim 1, wherein the data input circuit comprises a first input configured to receive a reference voltage and a second input configured to receive the input signal.

3. The data receiving circuit of claim 2, wherein the latch circuit is configured to output the output signal having a high logical value in the case that a voltage of the input signal is larger than the reference voltage.

4. The data receiving circuit of claim 2, wherein the latch circuit is configured to output the output signal having a low logical value in the case that a voltage of the input signal is less than the reference voltage.

5. The data receiving circuit of claim 1, wherein a logical value of the first signal is different from a logical value of the second signal.

6. The data receiving circuit of claim 1, wherein the period of the second signal is about one-third of the period of the first signal.

7. The data receiving circuit of claim 1, wherein the first signal is used to turn on the current source when the data input circuit is configured to receive the input signal.

8. The data receiving circuit of claim 7, wherein the second signal is used to turn on the data input circuit when the data input circuit is configured to receive the input signal.

9. The data receiving circuit of claim 8, wherein the second signal is used to turn off the data input circuit before a latch operation of the latch circuit has not been completed.

10. The data receiving circuit of claim 1, wherein the current source is configured to provide the current to the latch circuit without flowing through the data input circuit.

11. The data receiving circuit of claim 1, further comprising an equalizer, when enabled, configured to connect an output of the latch circuit and an output of the current source to ground.

* * * * *